(12) United States Patent
Ohara

(10) Patent No.: US 7,112,872 B2
(45) Date of Patent: Sep. 26, 2006

(54) FLEXIBLE SEMICONDUCTOR DEVICE WITH GROOVE(S) ON REAR SIDE OF SEMICONDUCTOR SUBSTRATE

(75) Inventor: Yoshikazu Ohara, Kitakatsuragi-gun (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/681,274

(22) Filed: Oct. 9, 2003

(65) Prior Publication Data
US 2004/0070053 A1    Apr. 15, 2004

(30) Foreign Application Priority Data
Oct. 15, 2002    (JP)    ............... 2002-300956

(51) Int. Cl.
*B81B 3/00*    (2006.01)
(52) U.S. Cl. ...................... 257/674; 257/668
(58) Field of Classification Search ............... 257/668, 257/669, 674, 738
See application file for complete search history.

(56) References Cited
U.S. PATENT DOCUMENTS
4,905,575 A * 3/1990 Knecht et al. .......... 92/103 SD
5,531,002 A * 7/1996 Okada .................... 29/25.41
5,912,427 A * 6/1999 Willis et al. ............ 102/202.8
2001/0012035 A1 * 8/2001 Silverbrook ................ 347/54

FOREIGN PATENT DOCUMENTS
JP    05-251616    9/1993
JP    11-204720    7/1999
JP    11-307586    11/1999
WO   WO 200079288 A1 *  12/2000

* cited by examiner

Primary Examiner—Minhloan Tran
Assistant Examiner—Thomas L. Dickey
(74) Attorney, Agent, or Firm—Nixon & Vanderhye P.C.

(57) ABSTRACT

To provide a semiconductor device capable of corresponding to an applied bending stress by flexibly changing its shape, and to provide a semiconductor device module, a manufacturing method of the semiconductor device, and a manufacturing method of the semiconductor device module. In a silicon substrate whose front surface is provided with an element forming layer having an element forming region where a semiconductor element is formed, a groove is formed in a portion of the rear surface of the silicon substrate corresponding to a region of the element forming layer where a semiconductor element is not formed.

4 Claims, 17 Drawing Sheets

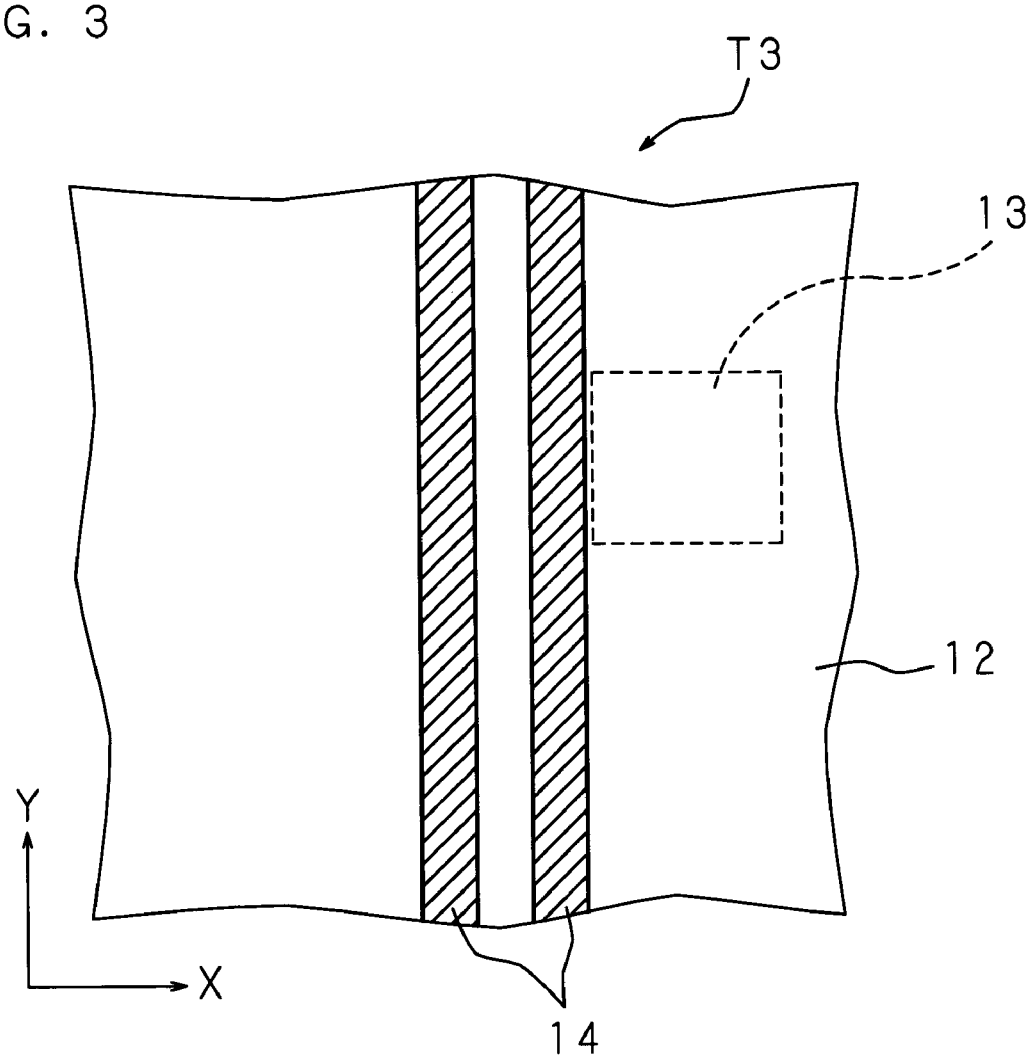

US 7,112,872 B2

FLEXIBLE SEMICONDUCTOR DEVICE WITH GROOVE(S) ON REAR SIDE OF SEMICONDUCTOR SUBSTRATE

BACKGROUND OF THE INVENTION

The present invention relates to a flexible semiconductor device, a semiconductor device module comprising the semiconductor device bonded to a bonding substrate, a manufacturing method of the semiconductor device, and a manufacturing method of the semiconductor device module.

DESCRIPTION OF THE RELATED ART

With an increasing demand for small-size, light-weight and high performance portable apparatuses such as mobile phones, research is being pursued to realize small-size and thin semiconductor devices and high-density bonding of semiconductor devices to a printed wiring board. An increase in the number of terminals to achieve the high-performance and small-size required for a semiconductor device was realized by changing a corresponding package from a QFP (Quad Flat Package) to an area array package such as BGA (Ball Grid Array) and CSP (Chip Size Package). Moreover, proposal of various wearable apparatuses is further promoted recently, and there is demand for small-size and flexible semiconductor devices. It is considered that the market for such wearable devices will continue to expand significantly.

FIG. 13A is a side view of a conventional semiconductor device, and FIG. 13B is a side view of a semiconductor device module comprising a conventional semiconductor device bonded to a bonding substrate. FIG. 14A is a side view of a conventional semiconductor device, and FIG. 14B is a side view of a semiconductor device module comprising a conventional semiconductor device bonded to a bonding substrate. FIG. 15A is a side view of a conventional semiconductor device, and FIG. 15B is a side view of a semiconductor device module comprising a conventional semiconductor device bonded to a bonding substrate.

FIG. 13A shows a QFP as a conventional semiconductor device. In this QFP, a semiconductor chip (not shown) is sealed by a sealing material 73 such as a resin, and an external connection terminal 74 electrically connected to the semiconductor chip with an Au wire or the like (not shown) sticks out of the sealing material 73. As shown in FIG. 13B, such a QFP is bonded to a bonding substrate 75 by using a solder paste or the like in the state in which the external connection terminal 74 and an electrode (not shown) mounted on the bonding substrate 75 are positioned to face each other (see, for example, Published Japanese Patent Application No. 5-251616/1993).

FIG. 14A shows a CSP as a conventional semiconductor device. In this CSP, a sealing material 76 sealing a semiconductor chip (not shown) is mounted on a wiring board 77, and an external connection terminal 78, which is electrically connected through the semiconductor chip and the wiring board 77, sticks out of the wiring board 77. As shown in FIG. 14B, such a CSP is bonded to a bonding substrate 79 in the state in which the external connection terminal 78 and an electrode (not shown) mounted on the bonding substrate 79 are positioned to face each other (see, for example, Published Japanese Patent Application No. 11-204720/1999).

FIG. 15A shows a semiconductor chip (bare chip) 80 having an external connection terminal 81 as a conventional semiconductor device. The external connection terminal 81 electrically connected to the semiconductor chip 80 sticks out. As shown in FIG. 15B, such a semiconductor chip 80 having the external connection terminal 81 is bonded to a bonding substrate 82 in the state in which the external connection terminal 81 and an electrode (not shown) mounted on the bonding substrate 82 are positioned to face each other (see, for example, Published Japanese Patent Application No. 11-307586/1999).

However, the above-described semiconductor devices do not have flexibility and are not suitable for use in developing wearable apparatuses.

FIG. 16A, FIG. 16B and FIG. 16C show examples of the state in which a bending stress is applied to a bonding substrate of a semiconductor device module in which a semiconductor device having high anti-bending strength among conventional semiconductor devices is bonded to the bonding substrate. In FIG. 16A, since a bonding substrate 84 was bent by the bending stress applied after bonding a QFP 83 to the bonding substrate 84, a large external stress is applied to an external connection terminal 85. Similarly, in FIG. 16B, since a bonding substrate 87 was bent by the bending stress applied after bonding a CSP 86 to the bonding substrate 87, a large external stress is applied to an external connection terminal 88. Similarly, in FIG. 16C, since a bonding substrate 90 was bent by the bending stress applied after bonding a semiconductor chip (bare chip) 89 having an external connection terminal 91 to the bonding substrate 90, a large external stress is applied to the external connection terminal 91. Thus, by applying a bending stress after bonding a semiconductor device having high anti-bending strength to a bonding substrate, a large external stress is applied to an external connection terminal section, and therefore there is a possibility that the semiconductor device may be damaged.

Further, FIG. 17A, FIG. 17B and FIG. 17C show examples of the state in which a bending stress is applied to a bonding substrate of a semiconductor device module in which a semiconductor device having low anti-bending strength among conventional semiconductor devices is bonded to the bonding substrate. In FIG. 17A, since a bonding substrate 93 was bent by the bending stress applied after bonding a QFP 92 to the bonding substrate 93, a large external stress is applied to the entire QFP 92 including an external connection terminal 94. Similarly, in FIG. 17B, since a bonding substrate 96 was bent by the bending stress applied after bonding a CSP 95 to the bonding substrate 96, a large external stress is applied to the entire CSP 95 including an external connection terminal 97. Similarly, in FIG. 17C, since a bonding substrate 99 was bent by the bending stress applied after bonding a semiconductor chip (bare chip) 98 having an external connection terminal 100 to the bonding substrate 99, a large external stress is applied to the external connection terminal 100 and the semiconductor chip 98. Thus, by applying a bending stress after bonding a semiconductor device having low anti-bending strength to a bonding substrate, a large external stress is applied to the entire semiconductor device including an external connection terminal, and therefore there is a possibility that the semiconductor device may be damaged.

SUMMARY OF THE INVENTION

The present invention has been made with the aim of solving the above problems, and it is an object of the present invention to provide a semiconductor device capable of flexibly changing its shape even when a bending stress is applied to a bonding substrate to which the semiconductor device is bonded, because of a groove formed in the rear surface thereof, and also to provide a semiconductor device module comprising the semiconductor device bonded to a bonding substrate, a manufacturing method of the semiconductor device, and a manufacturing method of the semiconductor device module.

A semiconductor device according to the present invention is a semiconductor device having an element forming region where a semiconductor element is formed and an element non-forming region where a semiconductor element is not formed, on a front surface of a silicon substrate, and characterized by comprising a groove formed in a portion of a rear surface of the silicon substrate corresponding to the element non-forming region.

In the present invention, since the groove is formed in the rear surface of the silicon substrate, when a bending stress is applied to the semiconductor device, the portion where the groove is formed can function as a flexible region which is curved according to the bending stress. Further, since the groove is formed in the portion of the rear surface of the silicon substrate corresponding to the element non-forming region, a portion corresponding to the element forming region is hardly curved, thereby preventing damage to the semiconductor element. Accordingly, even when a bending stress is applied to a bonding substrate to which the semiconductor device is bonded, the semiconductor device can flexibly correspond to the bending stress, thereby preventing damage.

A semiconductor device according to the present invention is characterized by comprising a plurality of the grooves. In the present invention, since a plurality of grooves are formed in the rear surface of the silicon substrate, when a bending stress is applied to the semiconductor device, the portion where a plurality of grooves are formed can function as a flexible region which is curved according to the bending stress. Further, the strength of the semiconductor device in thickness direction can be maintained by a portion sandwiched between the grooves.

A semiconductor device according to the present invention is characterized in that the grooves are formed parallel to each other. In the present invention, since the mutually parallel grooves are formed in the rear surface of the silicon substrate, the semiconductor device has flexibility to curve in a direction perpendicular to the grooves.

A semiconductor device according to the present invention is characterized in that the grooves are formed to extend in directions crossing each other. In the present invention, since the grooves extending in directions which cross each other are formed in the rear surface of the silicon substrate, the semiconductor device can be curved in directions perpendicular to the respective grooves and thus has further flexibility.

A semiconductor device according to the present invention is characterized in that the grooves are formed to extend in directions which cross substantially perpendicular to each other. In the present invention, since the grooves are formed to extend in directions which cross substantially perpendicular to each other in the rear surface of the silicon substrate, the semiconductor device can be curved in two directions which cross substantially perpendicular to the respective grooves.

A semiconductor device according to the present invention is characterized in that the grooves are formed to extend in three different directions. In the present invention, since the grooves are formed to extend in three different directions, the semiconductor device can be curved in directions perpendicular to the respective grooves, i.e., in almost all directions.

A semiconductor device according to the present invention is characterized in that the groove has a substantially uniform width from a bottom portion to an opening portion of the groove. In the present invention, since the groove with a substantially uniform width from the bottom portion to the opening portion is formed in the rear surface of the silicon substrate, there is no portion where the strength is locally weak in the vicinity of the groove. Therefore, even when the semiconductor device is curved, it is hardly damaged. Besides, such a groove can be easily formed.

A semiconductor device according to the present invention is characterized in that the groove has a wider width in an opening portion than in a bottom portion of the groove. In the present invention, since the groove with a wider width in the opening portion than in the bottom portion is formed in the rear surface of the silicon substrate, when the semiconductor device is curved, the restraint on the degree of bending at the groove portion is smaller compared to a semiconductor device with a groove having a uniform width, and thus this semiconductor device can be curved to a larger degree.

A semiconductor device according to the present invention is characterized in that the groove has a bottom portion with a curved surface. In the present invention, since the groove having the bottom portion with a curved surface is formed in the rear surface of the silicon substrate, a portion which is particularly weak against stress is not present in the bottom portion of the groove unlike the case with a groove whose bottom portion has an angular section which is weak against stress. It is therefore possible to reduce occurrence of cracks due to concentration of stress at the groove portion when the semiconductor device is curved.

A semiconductor device according to the present invention is characterized in that the groove is filled with a material softer than the silicon substrate. In the present invention, since the groove filled with the material softer than the silicon substrate is formed in the rear surface of the silicon substrate, angular sections that are the edges of the opening portion of the groove do not come into direct contact with each other when the semiconductor device is curved, thereby preventing damage to the semiconductor device that may occur by the contact.

A semiconductor device according to the present invention is characterized in that the rear surface of the silicon substrate is coated with a material softer than the silicon substrate. In the present invention, since the groove is formed in the rear surface of the silicon substrate and the rear surface of the silicon substrate is coated with the material softer than the silicon substrate, angular sections that are the edges of the opening portion of the groove do not come into direct contact with each other when the semiconductor device is curved, thereby preventing damage to the semiconductor device that may occur by the contact.

A semiconductor device according to the present invention is characterized in that a plurality of the element forming regions are formed isolated from each other, and the element non-forming region is a region sandwiched between the element forming regions. In the present invention, the groove is formed in a portion of the rear surface of the silicon substrate corresponding to the region sandwiched between a plurality of the element forming regions formed isolated from each other, the portion where the groove is formed is curved without hardly curving portions corresponding to the element forming regions when the semiconductor device is curved, and therefore the semiconductor device can flexibly correspond to the bending stress without damaging the semiconductor elements.

A semiconductor device module according to the present invention is characterized by bonding any one of the above-mentioned semiconductor devices of the present invention to a bonding substrate. In the present invention, since a semiconductor device having a groove in the rear surface of the silicon substrate is bonded to a bonding substrate, the semiconductor device can be curved in a shape corresponding to the shape of the bonding substrate.

A semiconductor device module according to the present invention is characterized in that the bonding substrate is curved. In the present invention, since the semiconductor device having the groove in the rear surface of the silicon substrate is bonded to the curved bonding substrate, the semiconductor device is curved in a shape corresponding to the curved shape of the bonding substrate, and consequently the semiconductor device module as a whole is curved. It is thus possible to position the semiconductor device module on a curved place.

A semiconductor device module according to the present invention is characterized in that the bonding substrate is formed to be capable of being curved. In the present invention, since the semiconductor device having the groove in the rear surface of the silicon substrate is bonded to the bonding substrate capable of being curved, when the semiconductor device module is positioned on a curved place or a place that may be curved, both of the bonding substrate and the semiconductor device can be curved according to the curved shape. Thus, since the semiconductor device module can be positioned on places in a variety of forms, it is very useful.

A manufacturing method of a semiconductor device according to the present invention is characterized by forming a semiconductor element in a predetermined region of the front surface of the silicon substrate, and grinding the rear surface of the silicon substrate so as to form a groove in a portion corresponding to a region where a semiconductor element is not formed. In the present invention, since the groove is formed by grinding, the groove can be formed by a general method for use in dividing a wafer into individual semiconductor devices. Besides, the bottom portion of the groove can be formed in a desired shape by selecting a shape of the edge of a dicing blade for use in grinding. Further, there is no need to form patterns for groove formation, and the manufacturing process is easy.

A manufacturing method of a semiconductor device according to the present invention is characterized by forming a semiconductor element in a predetermined region of the front surface of the silicon substrate, and etching the rear surface of the silicon substrate so as to form a groove in a portion corresponding to a region where a semiconductor element is not formed. In the present invention, since the groove is formed by etching, it is possible to selectively remove the rear surface of the silicon substrate by using patterns for groove formation. In addition, it is possible to prevent mechanical damage to the semiconductor device. Further, either of dry etching or wet etching may be used, and the groove can be formed by selecting a suitable etching method according to the manufacturing process.

A manufacturing method of a semiconductor device according to the present invention is characterized in that the etching is dry etching. In the present invention, with the formation of the groove by dry etching, it is possible to form the groove with a substantially uniform width from the bottom portion to the opening portion, which is substantially faithful to the used patterns for groove formation.

A manufacturing method of a semiconductor device according to the present invention is characterized in that the etching is wet etching. In the present invention, with the formation of the groove by wet etching, the groove with a wider width in the opening portion than in the bottom portion can be formed. Besides, it is also possible to form the groove whose bottom portion has a curved surface without angular portions.

A manufacturing method of a semiconductor device module according to the present invention is characterized by bonding a semiconductor device manufactured by any one of the above-mentioned manufacturing methods of a semiconductor device of the present invention to a flat bonding substrate by holding the semiconductor device with a holding tool having a flat holding surface for holding the semiconductor device. In the present invention, since the semiconductor device having the groove formed in the rear surface of the silicon substrate is bonded to the flat bonding substrate by holding the semiconductor device with the holding tool having the flat holding surface, the semiconductor device is held in a flat shape corresponding to the holding surface without being bent, and thus the semiconductor device can be bonded along the flat bonding substrate.

A manufacturing method of a semiconductor device module according to the present invention is characterized by bonding a semiconductor device manufactured by any one of the above-mentioned manufacturing methods of the present invention to a curved bonding substrate by holding the semiconductor device with a holding tool having a curved holding surface for holding the semiconductor device. In the present invention, since the semiconductor device having the groove in the rear surface of the silicon substrate is bonded to the curved bonding substrate by holding the semiconductor device with the holding tool having the curved holding surface, the semiconductor device is held in a curved shape corresponding to the holding surface, and thus the semiconductor device can be bonded along the curved bonding substrate.

A manufacturing method of a semiconductor device module according to the present invention is characterized in that the holding surface of the holding tool has a shape corresponding to the curved shape of the bonding surface of the bonding substrate. In the present invention, the semiconductor device having the groove in the rear surface of the silicon substrate is bonded to the bonding substrate by holding the semiconductor device with the holding tool having a holding surface curved in a shape corresponding to the curved shape of the bonding surface of the bonding substrate. Accordingly, since the semiconductor device is held in a curved shape corresponding to the bonding surface, it is possible to bond the semiconductor substrate more precisely along the curved bonding substrate.

The above and further objects and features of the invention will more fully be apparent from the following detailed description with accompanying drawings.

BRIEF DESCRIPTION OF THE DRAWINGS

FIG. 3 is a bottom view of a semiconductor chip according to Embodiment 2 of the present invention;

DETAILED DESCRIPTION OF THE PREFERRED EMBODIMENTS

Figure 1A:
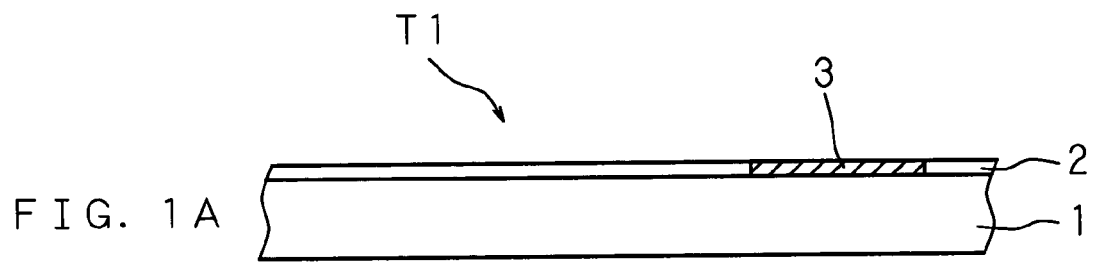
FIG. 1A, FIG. 1B and FIG. 1C are cross sections of a semiconductor chip according to Embodiment 1 of the present invention.

The following description will explain the present invention, based on the drawing illustrating some embodiments thereof.

Embodiment 1

Figure 1B:
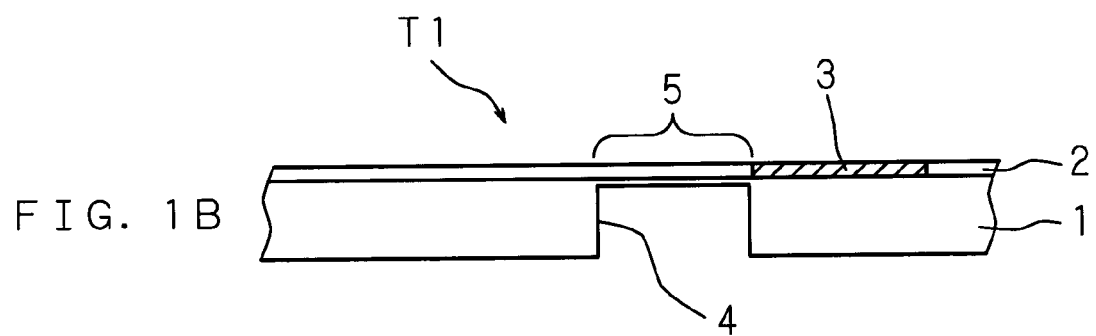
Figure 1C:
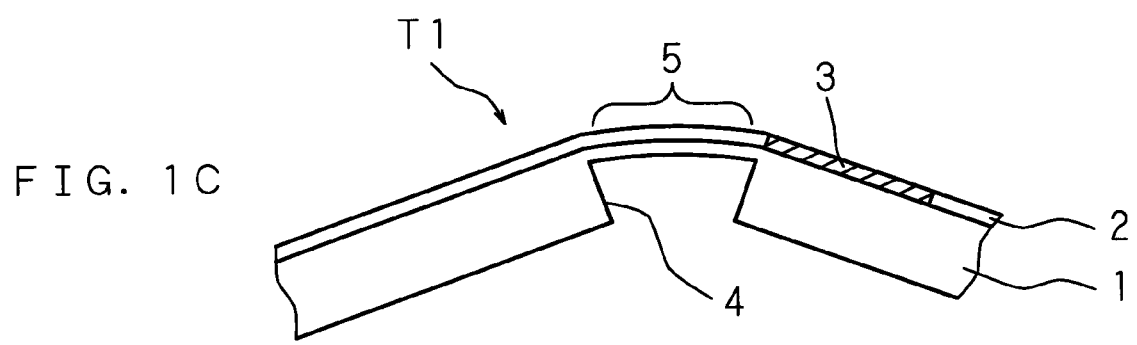

FIG. 1A, FIG. 1B and FIG. 1C are cross sections of a semiconductor chip as a semiconductor device according to Embodiment 1 of the present invention.

First, as shown in FIG. 1A, in an element forming region 3 of an element forming layer 2, formed on the front surface of a silicon substrate 1, for forming a semiconductor element, a semiconductor element (not shown) is formed by a general method. Thereafter, as shown in FIG. 1B, in a portion of the rear surface of the silicon substrate 1 corresponding to a region of the element forming layer 2 where a semiconductor element is not formed (hereinafter referred to as the element non-forming region), a groove 4 is formed within the range of thickness of the silicon substrate 1 by, for example, a grinding method using a dicing saw, or an etching method. The etching method may be either a dry etching method or a wet etching method.

In a semiconductor chip T1 thus formed, since a thin film portion 5 is formed at a position which does not affect the semiconductor element formed in the element forming region 3, as shown in FIG. 1C, when a bending stress is applied, the thin film portion 5 can function as a flexible region and consequently the semiconductor chip T1 as a whole becomes flexible.

Embodiment 2

Figure 2A:
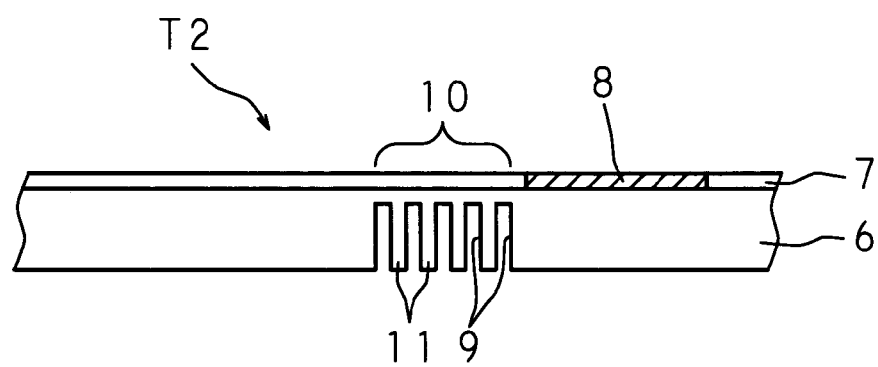
FIG. 2A and FIG. 2B are cross sections of a semiconductor chip according to Embodiment 2 of the present invention.
Figure 2B:
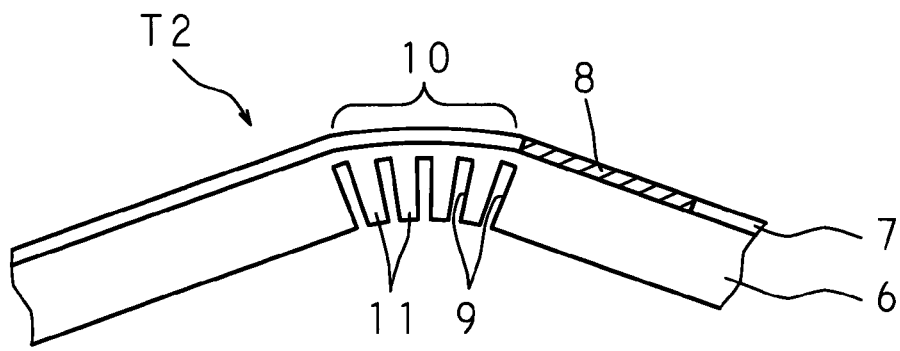

FIG. 2A and FIG. 2B are cross sections of a semiconductor chip as a semiconductor device according to Embodiment 2 of the present invention. In Embodiment 1, as shown in FIG. 1A, etc., one groove 4 is formed in the rear surface of the silicon substrate 1, whereas in Embodiment 2, a plurality of grooves are formed in the rear surface of the silicon substrate 1.

Specifically, as shown in FIG. 2A, a plurality of grooves 9 (five grooves in FIG. 2A) are formed in the same manner as in Embodiment 1, in a portion of the rear surface of a silicon substrate 6 whose front surface is provided with an element forming layer 7 having an element forming region 8 where a semiconductor element (not shown) is formed, the portion corresponding to an element non-forming region of the element forming layer 7. In a semiconductor chip T2 thus formed, since a thin film portion 10 including a plurality of grooves 9 is formed at a position which does not affect the semiconductor element formed in the element forming region 8, as shown in FIG. 2B, when a bending stress is applied, the thin film portion 10 can function as a flexible region.

Moreover, in the thin film portion 10 including a plurality of grooves 9, since the grooves 9 are formed, the sections between the respective grooves 9 function as supports 11 whose height is equal to the depth of the grooves 9, and thus the semiconductor chip T2 has a larger strength in the thickness direction compared to the semiconductor chip T1 of Embodiment 1.

FIG. 3 is a bottom view of a semiconductor chip. Suppose that a direction parallel to one side of a substantially rectangular rear surface of a silicon substrate 12 is the X direction, and a direction parallel to a side substantially perpendicular to the above-mentioned one side is the Y direction. Similarly to the semiconductor chip T2 shown in FIG. 2A, etc., a plurality of grooves 14 (two grooves in FIG. 3) are formed parallel to each other in the Y direction in the rear surface of the silicon substrate 12. A semiconductor chip T3 thus formed can be curved in the X direction perpendicular to the grooves 14, 14. Note that one side of an element forming region 13 of an element forming layer (not shown) formed on the front surface of the silicon substrate 12 and the grooves 14, 14 may be parallel as shown in FIG. 3, or may not be parallel.

Embodiment 3

Figure 4:
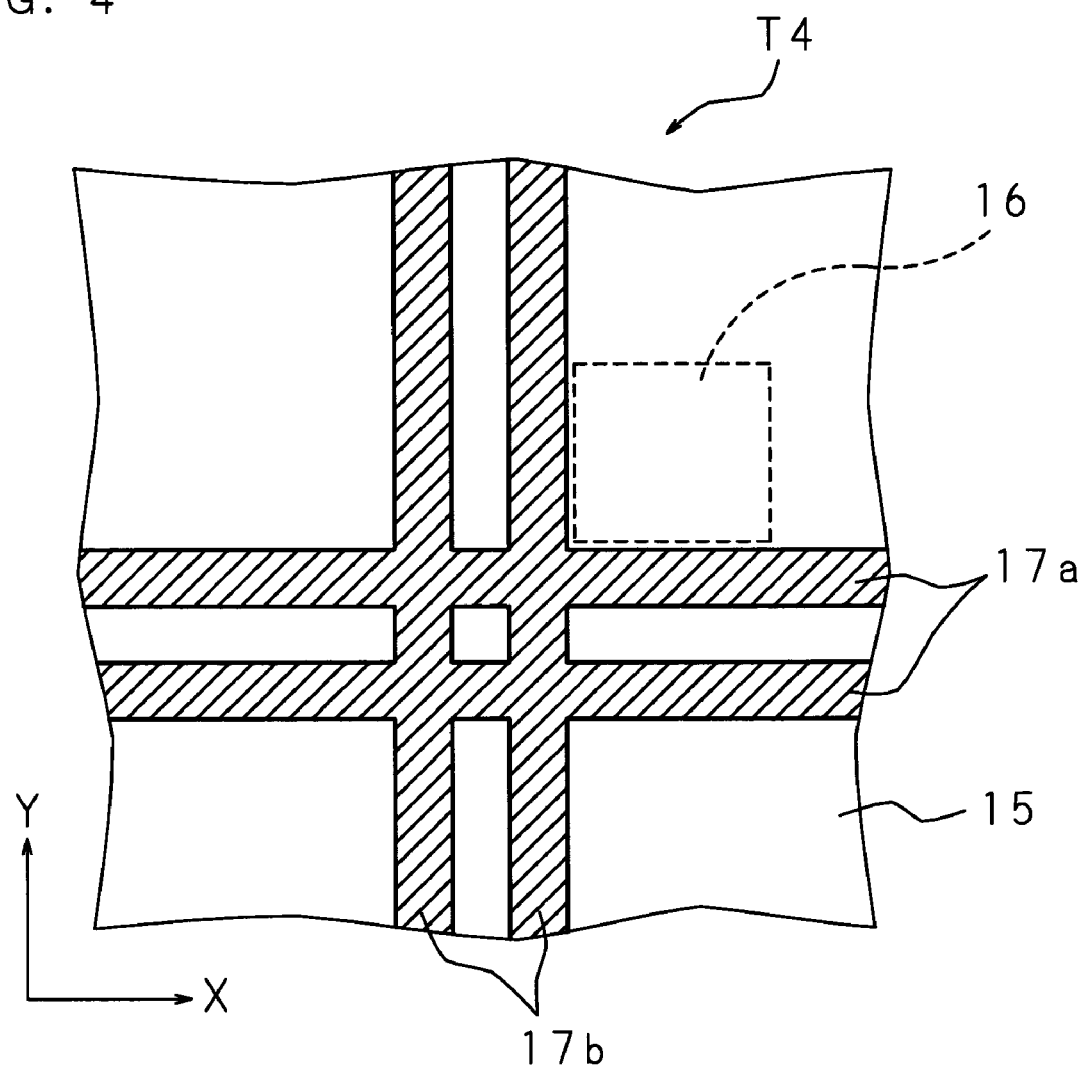
FIG. 4 is a bottom view of a semiconductor chip according to Embodiment 3 of the present invention.

FIG. 4 is a bottom view of a semiconductor chip as a semiconductor device according to Embodiment 3 of the present invention. In Embodiment 2, for example, as shown in FIG. 3, a plurality of grooves 14 are formed parallel to each other in the rear surface of the silicon substrate 12, whereas in Embodiment 3, a plurality of grooves are formed to extend in directions crossing each other in the rear surface of a silicon substrate.

As shown in FIG. 4, suppose that a direction parallel to one side of a substantially rectangular rear surface of a silicon substrate 15 is the X direction, and a direction parallel to a side substantially perpendicular to the above-mentioned one side is the Y direction. In the rear surface of the silicon substrate 15 whose front surface is provided with an element forming layer (not shown) having an element forming region 16 where a semiconductor element (not shown) is formed, a plurality of grooves 17a, 17a (two grooves in FIG. 4) are formed to extend substantially in the X direction and a plurality of grooves 17b, 17b (two grooves in FIG. 4) are formed to extend substantially in the Y direction in a portion corresponding to an element non-forming region of the element forming layer. As a result, a portion of the rear surface of the silicon substrate 15, which is enclosed by the four grooves 17a, 17a, 17b, 17b and formed as a raised part, is square in shape.

Thus, since a semiconductor chip T4 formed with the grooves 17a, 17a and the grooves 17b, 17b that cross substantially perpendicularly can be curved in the Y direction perpendicular to the grooves 17a, 17a and also in the X direction perpendicular to the grooves 17b, 17b, it can flexibly correspond to a bending stress. Note that one side of the element forming region 16 and the grooves 17a, or the grooves 17b, may be parallel as shown in FIG. 4, or may not be parallel.

Embodiment 4

Figure 5:
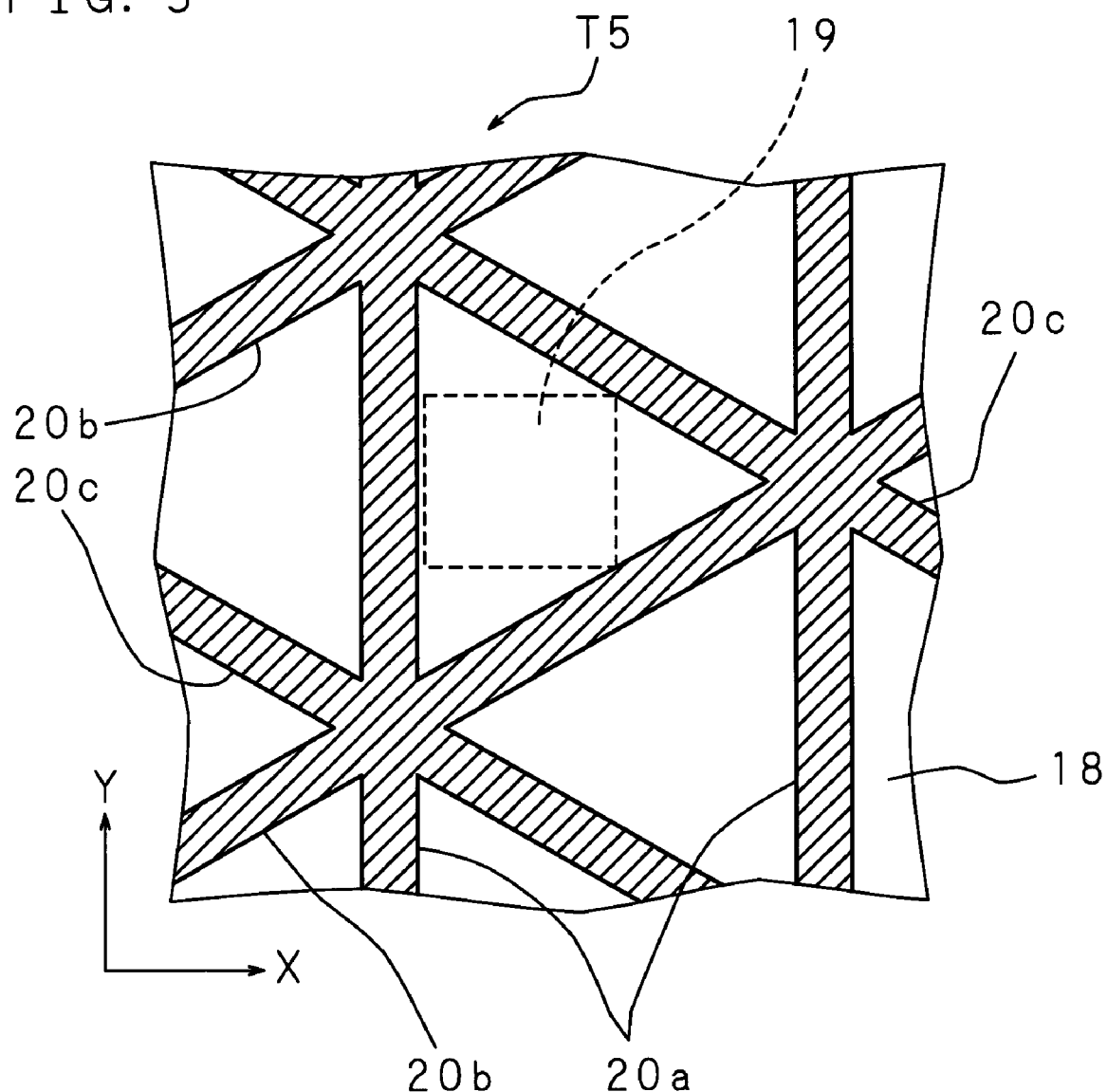
FIG. 5 is a bottom view of a semiconductor chip according to Embodiment 4 of the present invention.

FIG. 5 is a bottom view of a semiconductor chip as a semiconductor device according to Embodiment 4 of the present invention. In Embodiment 3, as shown in FIG. 4, the grooves 17a, 17a and the grooves 17b, 17b that cross substantially perpendicular to each other are formed in the rear surface of the silicon substrate 15, whereas in Embodiment 4, a plurality of different grooves are formed to extend in three different directions.

Specifically, as shown in FIG. 5, in the rear surface of a silicon substrate 18 whose front surface is provided with an element forming layer (not shown) having an element forming region 19 where a semiconductor element (not shown) is formed, grooves 20a, 20a are formed parallel to each other and grooves 20b, 20b are formed to extend in a direction tilted about 60 degrees with respect to the grooves 20a, in a portion corresponding to an element non-forming region of the element forming layer. Further, grooves 20c, 20c are formed to extend in a direction tilted about 120 degrees with respect to the grooves 20a (i.e., about 60 degrees with respect to the grooves 20b). As a result, a portion of the rear surface of the silicon substrate 18, which is enclosed by the three grooves 20a, 20b, 20c and formed as a raised part, is triangular in shape.

Thus, a semiconductor chip T5 formed with the grooves 20a, 20a, the grooves 20b, 20b and the grooves 20c, 20c that extend in three different directions, respectively, can be curved in directions perpendicular to the respective grooves. In other words, since the semiconductor chip T5 can be curved in almost all directions, it can flexibly correspond to bending stresses in a variety of directions.

Note that one side of the element forming region 19 and the grooves extending in one direction among the grooves 20a, 20a, grooves 20b, 20b and grooves 20c, 20c may be parallel as shown in FIG. 6, or may not be parallel. Besides, in this embodiment, although two grooves 20a, 20a, two grooves 20b, 20b and two grooves 20c, 20c are illustrated, the number of each of these grooves 20a, 20b, 20c may be one, or three or more.

Embodiment 5

Figure 6A:
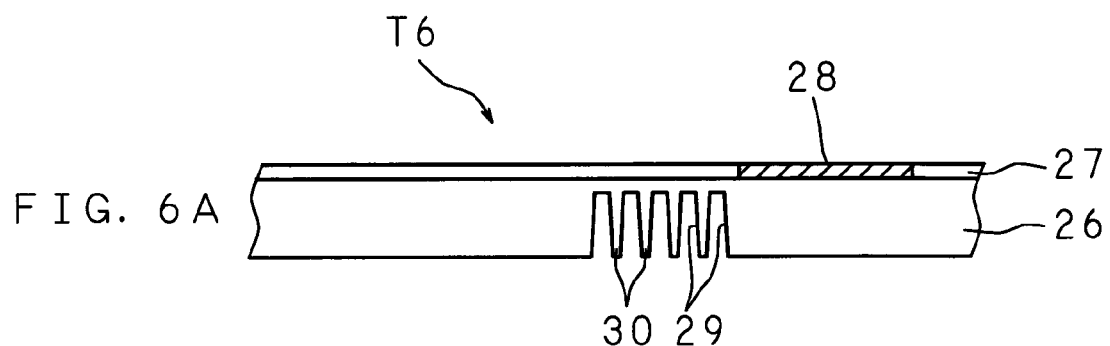
FIG. 6A and FIG. 6B are cross sections of a semiconductor chip according to Embodiment 5 of the present invention.
Figure 6B:
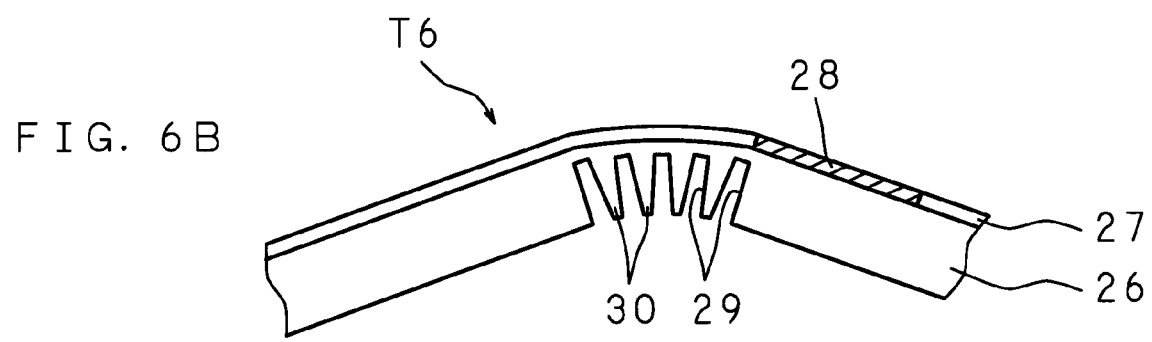

FIG. 6A, FIG. 6B and FIG. 6C are cross sections of a semiconductor chip as a semiconductor device according to Embodiment 5 of the present invention. In Embodiments 1 through 4, for example, as shown in FIG. 2A, the grooves 9, 9 . . . whose widths from their bottom portion to the opening portion are substantially equal are formed in the rear surface of the silicon substrate 6. In this case, since the groove width is substantially uniform, there is no portion where the strength is locally weak, and thus this semiconductor chip is strong against stress. Moreover, a tool for forming the grooves 9 is simple, and the formation process is easy. Whereas in Embodiment 5, grooves with a wider groove width in the opening portion than a groove width in the bottom portion are formed.

Specifically, as shown in FIG. 6A, in the rear surface of a silicon substrate 26 whose front surface is provided with an element forming layer 27 having an element forming region 28 where a semiconductor element (not shown) is formed, grooves 29, 29 . . . are formed in a portion corresponding to an element non-forming region of the element forming layer 27 so that the groove width is narrow in the bottom portion and becomes wider toward the opening portion. In a semiconductor chip T6 with the grooves 29, 29 . . . thus formed, since the grooves 29, 29 . . . are formed, the sections between the respective grooves 29 function as supports 30, 30 . . . for maintaining the strength in thickness direction of the semiconductor chip T6.

FIG. 6B shows a state in which the semiconductor chip T6 provided with the grooves 29, 29 . . . is curved by the application of a bending stress. The width of the supports 30, 30 . . . becomes narrower from the front surface to the rear surface of the silicon substrate 26, according to the shape of the grooves 29, 29 . . . . Therefore, compared to the semiconductor chip T2 shown in FIG. 2B in which the width of the grooves 9, 9 . . . is substantially uniform from the bottom portion to the opening portion, the restraint on the degree of bending at the section of the grooves 29, 29 . . . is smaller, and consequently the semiconductor chip T6 can be curved to a larger degree.

Embodiment 6

Figure 7:
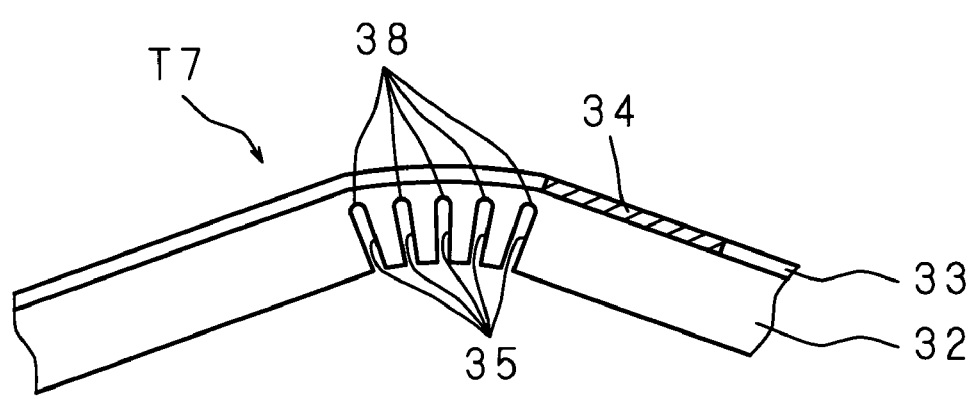
FIG. 7 is a cross section of a semiconductor chip according to Embodiment 6 of the present invention.

FIG. 7 is a cross section of a semiconductor chip as a semiconductor device according to Embodiment 6 of the present invention. In Embodiments 1 through 5, for example, as shown in FIG. 2A, the grooves 9, 9 . . . having angular sections in their bottom portions are formed in the rear surface of the silicon substrate 6. In this case, when the semiconductor chip T2 is curved, there is a possibility that splitting called cracks may occur from the vicinity of the angular sections due to concentration of stress at the angular sections. On the other hand, in Embodiment 6, grooves having no angular sections in their bottom portions are formed.

Specifically, as shown in FIG. 7, in the rear surface of a silicon substrate 32 whose front surface is provided with an element forming layer 33 having an element forming region 34 where a semiconductor element (not shown) is formed, grooves 35, 35 . . . are formed in a portion corresponding to an element non-forming region of the element forming layer 33 so that their bottom portions become curved sections 38, 38, . . . having no angle. Accordingly, in a semiconductor chip T7 having the grooves 35, 35 . . . whose bottom portions are the curved sections 38, 38 . . . , since a portion which is particularly weak against stress is not present in the vicinity of the curved sections 38, 38 . . . that are the bottom portions, it is possible to reduce occurrence of cracks in the section of the grooves 35, 35 . . . when a bending stress is applied to the semiconductor chip T7.

Note that although a plurality of grooves 35, 35 . . . are formed in this embodiment, the semiconductor chip may have only one groove. Besides, although the configuration in which the grooves 35, 35 . . . having a substantially uniform width from their bottom portions to the opening portions is illustrated, the semiconductor chip may have grooves with a wider groove width in the opening portions than a groove width in the bottom portions.

Embodiment 7

Figure 8A:
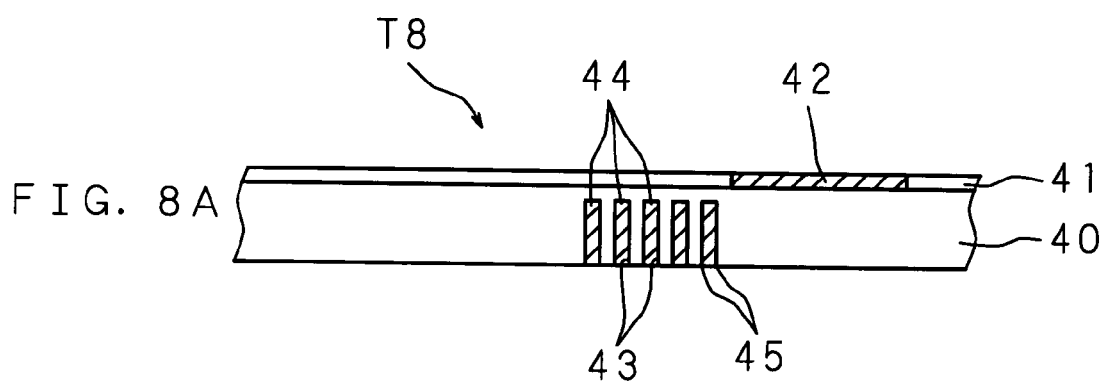
FIG. 8A and FIG. 8B are cross sections of a semiconductor chip according to Embodiment 7 of the present invention.
Figure 8B:
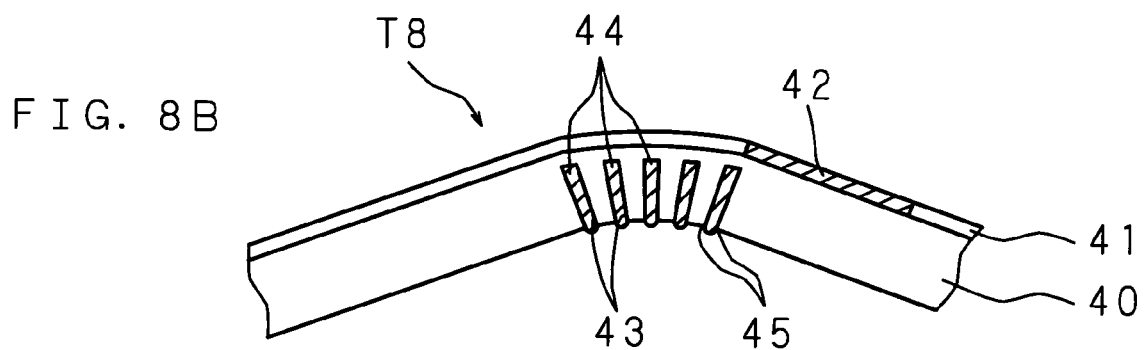

FIG. 8A and FIG. 8B are cross sections of a semiconductor chip as a semiconductor device according to Embodiment 7 of the present invention. In Embodiments 1 through 6, for example, as shown in FIG. 2A, the grooves 9, 9 . . . which are hollow inside are formed in the rear surface of the silicon substrate 6, whereas in Embodiment 7, grooves filled with a filling material are formed.

Specifically, as shown in FIG. 8A, in the rear surface of a silicon substrate 40 whose front surface is provided with an element forming layer 41 having an element forming region 42 where a semiconductor element (not shown) is formed, grooves 43, 43 . . . are formed in a portion corresponding to an element non-forming region of the element forming layer 41. Then, the formed grooves 43, 43 . . . are filled with a filling material 44 softer than the silicon substrate 40, for example, an elastic material such as rubber.

FIG. 8B shows a state in which a semiconductor chip T8 having the grooves 43, 43 . . . filled with the filling material 44 is curved by the application of a bending stress. Since the filling material 44 is softer than the silicon substrate 40, the semiconductor chip T8 can be curved at the region where the grooves 43, 43 . . . are formed. Moreover, since the grooves 43, 43 . . . are filled with the filling material 44, it is possible to prevent angular sections 45, 45 . . . that are the edges of the opening portions of the grooves 43, 43 . . . from coming into direct contact with each other, thereby preventing the semiconductor chip T8 from being damaged by the contact.

Embodiment 8

Figure 9A:
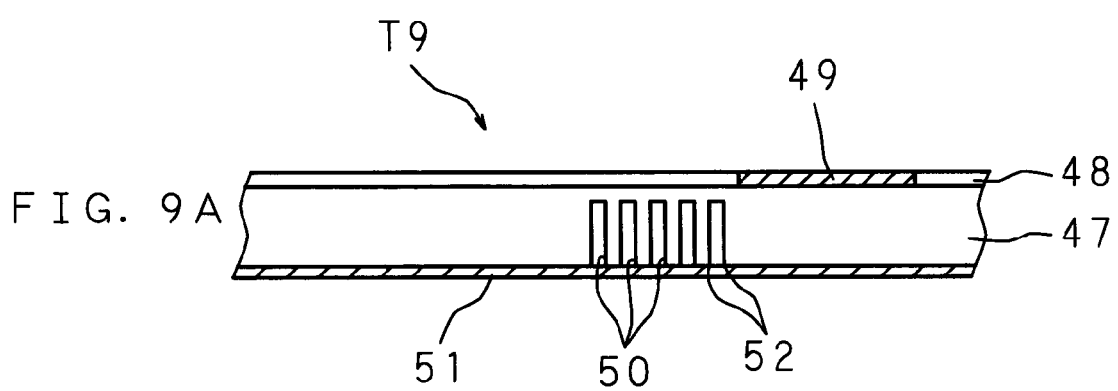
FIG. 9A and FIG. 9B are cross sections of a semiconductor chip according to Embodiment 8 of the present invention.
Figure 9B:
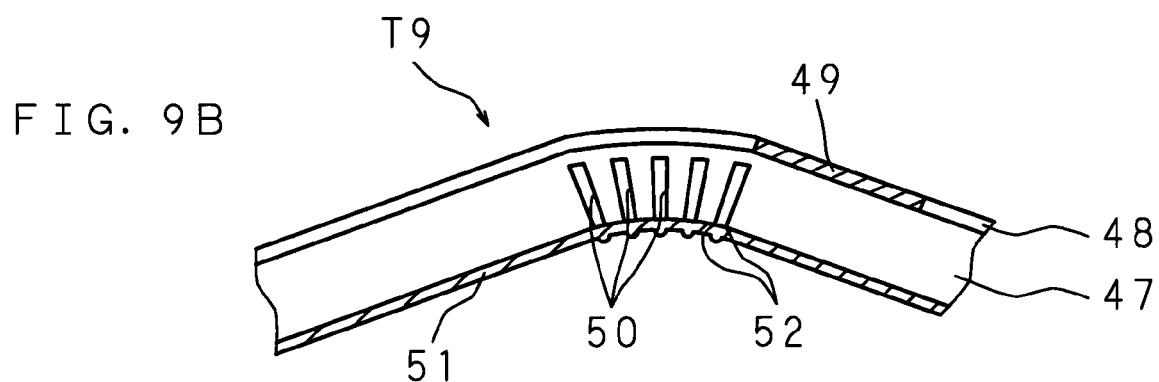

FIG. 9A and FIG. 9B are cross sections of a semiconductor chip as a semiconductor device according to Embodiment 8 of the present invention. In Embodiment 7, for example, as shown in FIG. 8A, the grooves 43, 43 . . . filled with the filling material 44 are formed in the rear surface of the silicon substrate 40, whereas in Embodiment 8, groves are formed in the rear surface of a silicon substrate and the rear surface of the silicon substrate is coated with a coating material.

Specifically, as shown in FIG. 9A, in the rear surface of a silicon substrate 47 whose front surface is provided with an element forming layer 48 having an element forming region 49 where a semiconductor element (not shown) is formed, grooves 50, 50 . . . are formed in a portion corresponding to an element non-forming region of the element forming layer 48. Then, the rear surface of the silicon substrate 47 where the grooves 50, 50 . . . are formed is coated with a coating material 51 softer than the silicon substrate 47, for example, an elastic material such as rubber.

FIG. 9B shows a state in which a semiconductor chip T9 comprising the silicon substrate 47 whose rear surface provided with the grooves 50, 50 . . . is coated with the coating material 51 is curved by the application of a bending stress. Since the coating material 51 is softer than the silicon substrate 47, the semiconductor chip T8 can be curved. Moreover, since the opening portions of the grooves 50, 50 . . . are coated with the coating material 51, it is possible to prevent angular sections 52, 52 . . . that are the edges of the opening portions of the grooves 50, 50 . . . from coming into direct contact with each other, thereby preventing the semiconductor chip T8 from being damaged by the contact.

Embodiment 9

Figure 10:
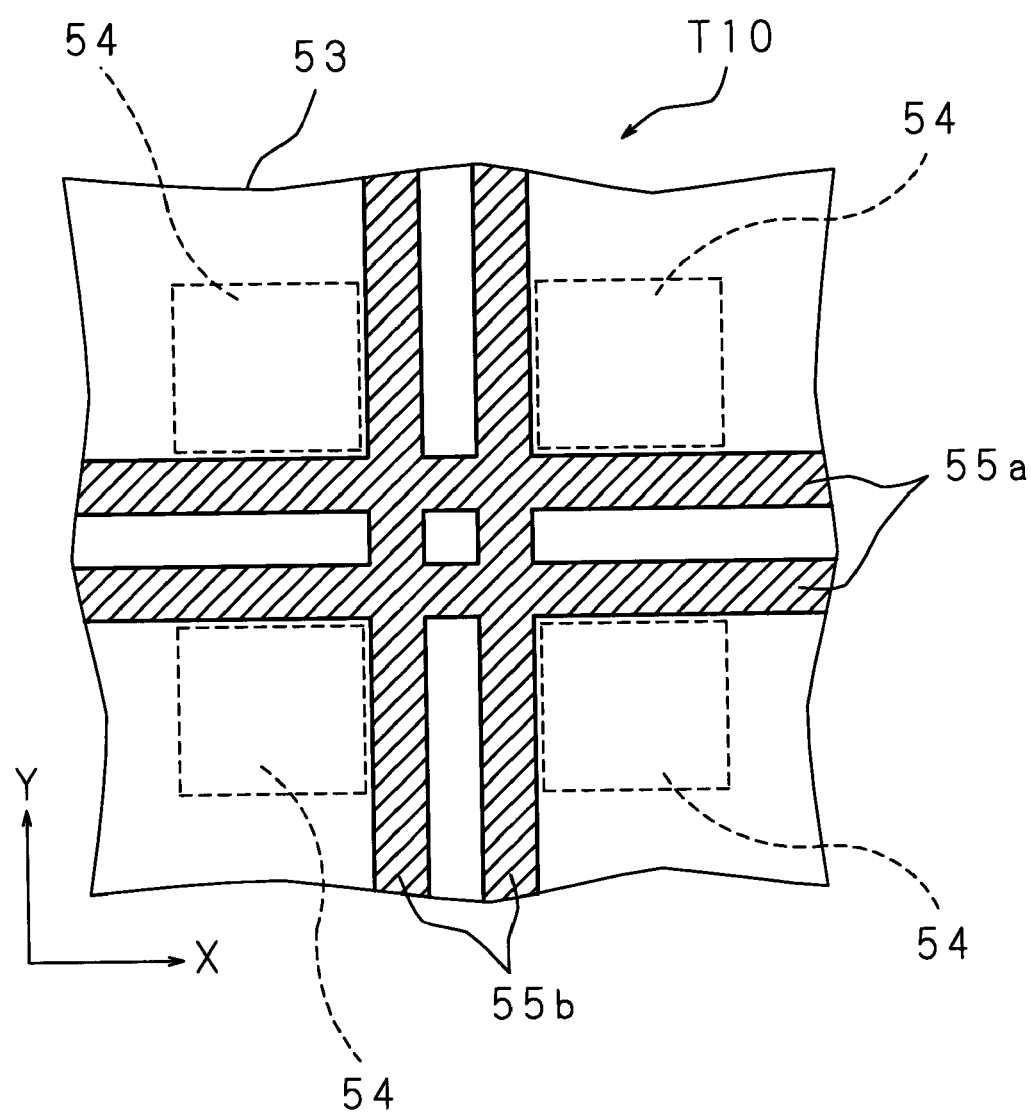
FIG. 10 is a bottom view of a semiconductor chip according to Embodiment 9 of the present invention.

FIG. 10 is a bottom view of a semiconductor chip as a semiconductor device according to Embodiment 9 of the present invention. In Embodiments 1 through 8, for example, as shown in FIG. 4, when one element forming region 16 is formed in the element forming layer (not shown), the grooves 17*a*, 17*a*, 17*b*, 17*b* are formed in a portion of the rear surface of the silicon substrate 15 corresponding to an element non-forming region of the element forming layer, whereas in Embodiment 9, a plurality of element forming regions are formed in the element forming layer and grooves are formed in the rear surface of the silicon substrate.

Specifically, as shown in FIG. 10, in the rear surface of a silicon substrate 53 whose front surface is provided with an element forming layer (not shown) where element forming regions 54, 54 . . . with a semiconductor element (not shown) formed therein are formed isolated from each other, grooves 55*a*, 55*a*, 55*b*, 55*b* similar to those shown in FIG. 4 are formed in portions corresponding to regions sandwiched between the respective element forming regions 54, which serve as the element non-forming regions of the element forming layer.

Accordingly, in a semiconductor chip T10 provided with such grooves 55*a*, 55*a*, 55*b*, 55*b*, when a bending stress is applied, the portion of the silicon substrate 53 where the grooves 55*a*, 55*a* are formed and the portion where the grooves 55*b*, 55*b* are formed can be curved as the flexible regions, without hardly curving the portions corresponding to the element forming regions 54, 54 . . . .

Embodiment 10

Figure 11A:
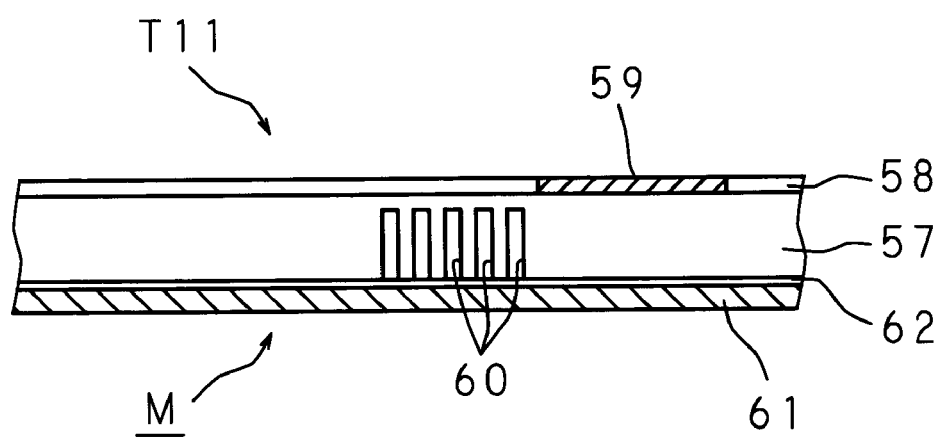
FIG. 11A and FIG. 11B are cross sections of a semiconductor device module according to the present invention.
Figure 11B:
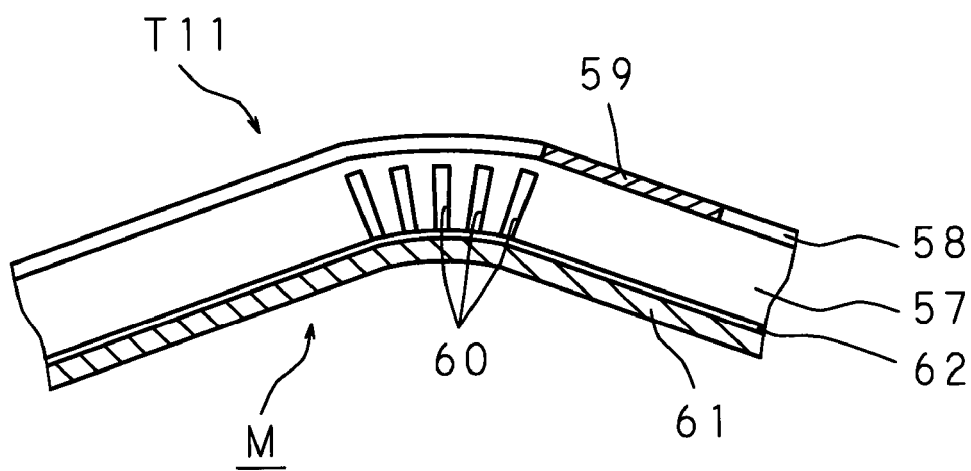

FIG. 11A and FIG. 11B are cross sections of a semiconductor device module comprising a semiconductor chip as a semiconductor device according to the present invention bonded to a bonding substrate. As shown in FIG. 11A, a semiconductor chip T11 is bonded to a bonding substrate 61 with the use of a bonding material 62 or the like. The semiconductor chip T11 is flexible because of a plurality of grooves 60, 60 . . . formed in a portion of the rear surface of a silicon substrate 57 whose front surface is provided with an element forming layer 58 having an element forming region 59 where a semiconductor element (not shown) is formed, the portion corresponding to an element non-forming region of the element forming layer 58.

In a semiconductor device module M formed as described above, if the bonding substrate 61 is a flexible substrate of polyimide or the like, when an external stress such as a bending stress is applied to the bonding substrate 61, as shown in FIG. 11B, the bonding substrate 61 is curved and accordingly the semiconductor chip T11 is also curved. Thus, the semiconductor device module M as a whole can be flexibly curved. Note that if the bonding substrate 61 is a rigid substrate of glass epoxy or the like, when it is curved, the semiconductor chip T11 can be curved according to the curved shape of the bonding substrate 61, and therefore the semiconductor device module as a whole has a curved shape as shown in FIG. 11B.

Figure 12A:
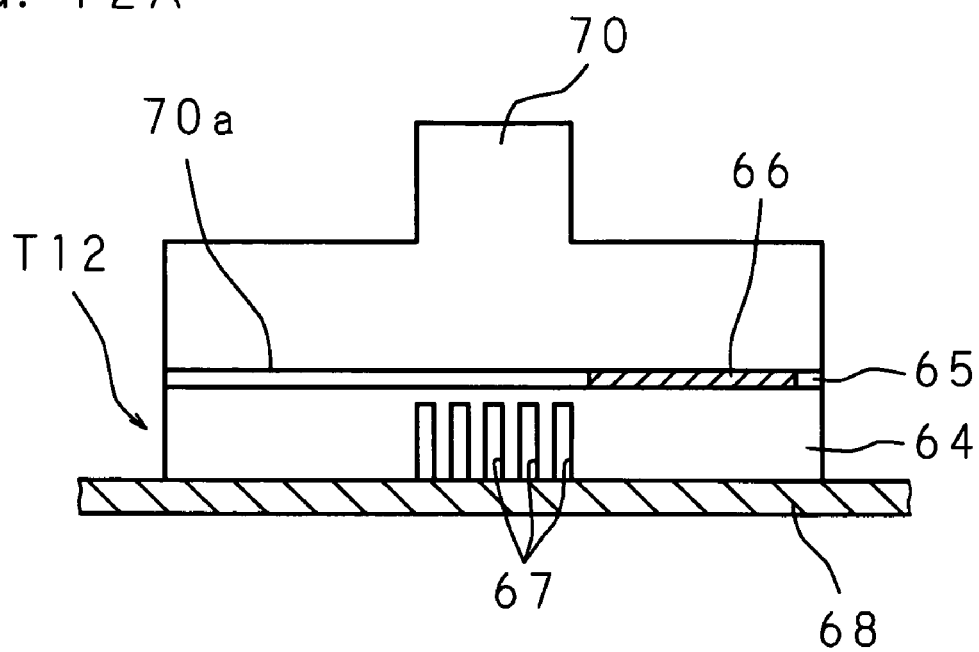
FIG. 12A and FIG. 12B are schematic views showing a manufacturing method of a semiconductor device module according to the present invention.
Figure 12B:
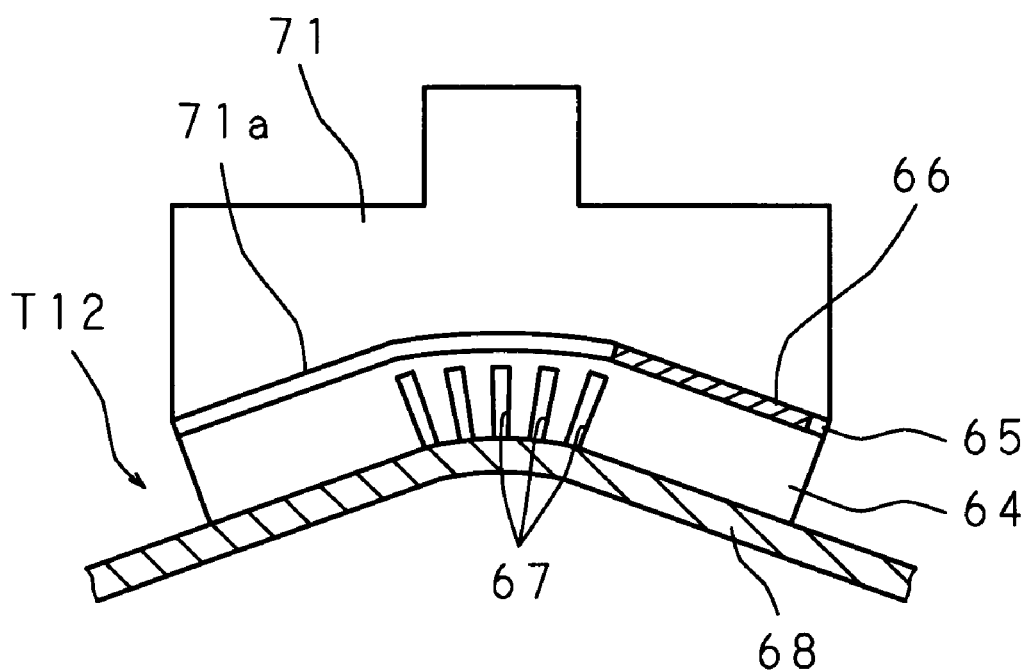
Figure 13A:
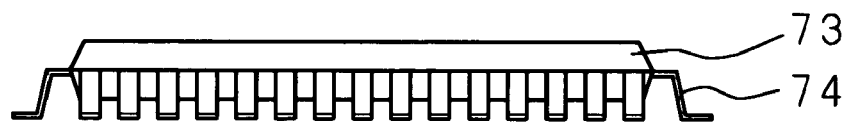
FIG. 13A is a side view of a conventional semiconductor device.
Figure 13B:
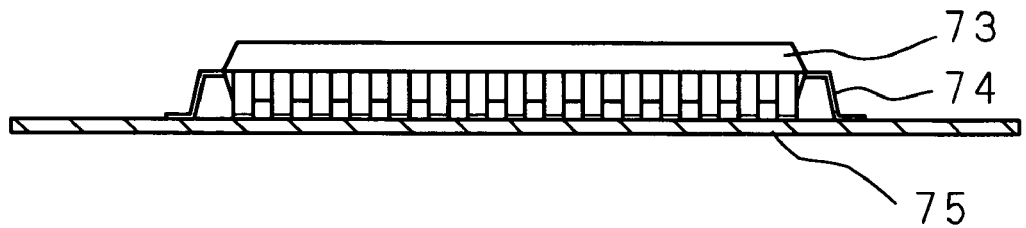
FIG. 13B is a side view of a semiconductor device module comprising a conventional semiconductor device bonded to a bonding substrate.
Figure 14A:
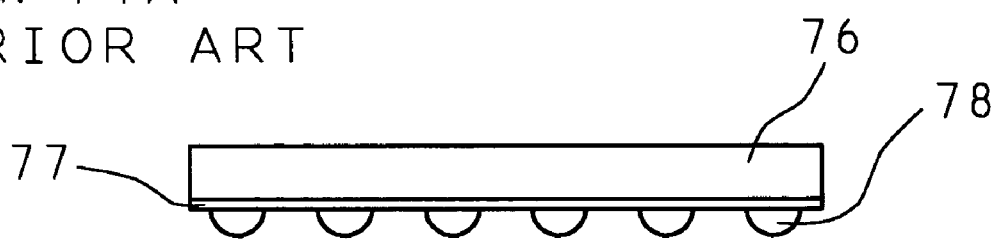
FIG. 14A is a side view of a conventional semiconductor device.
Figure 14B:
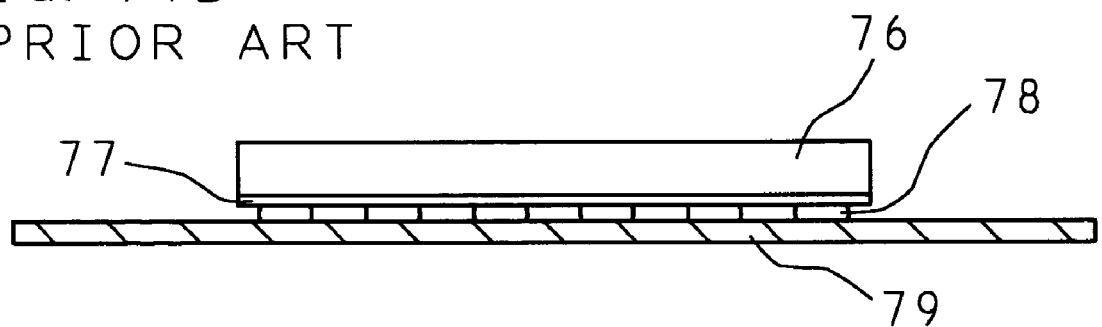
FIG. 14B is a side view of a semiconductor device module comprising a conventional semiconductor device bonded to a bonding substrate.
Figure 15A:
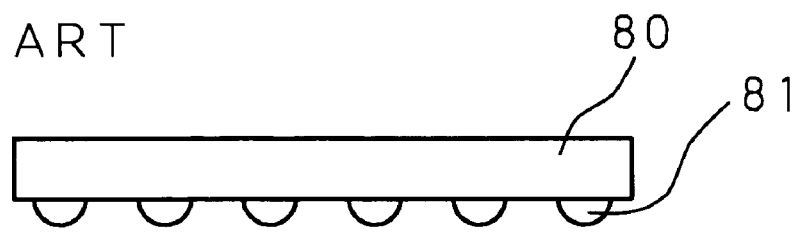
FIG. 15A is a side view of a conventional semiconductor device.
Figure 15B:
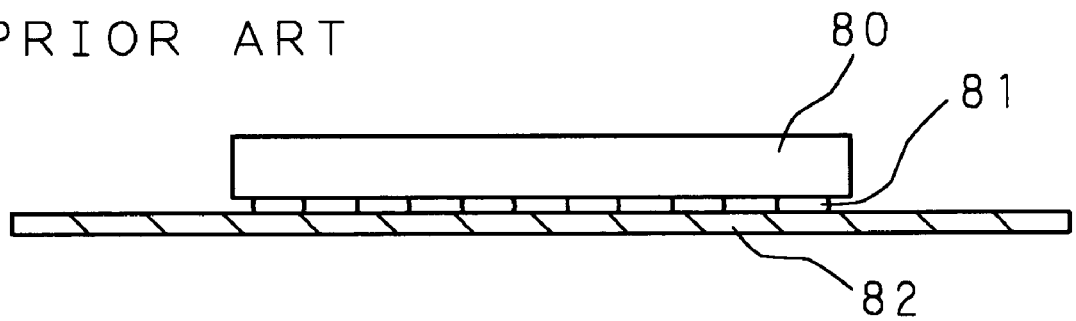
FIG. 15B is a side view of a semiconductor device module comprising a conventional semiconductor device bonded to a bonding substrate.
Figure 16A:
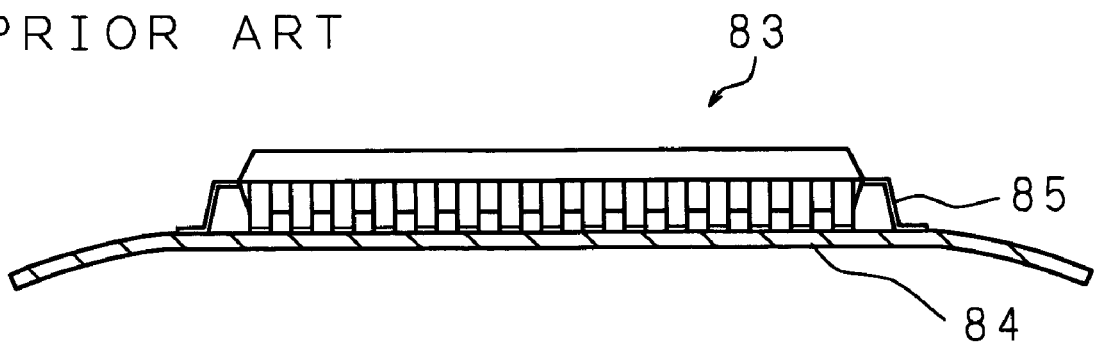
FIG. 16A, FIG. 16B and FIG. 16C are schematic views showing the state in which a bending stress is applied to a bonding substrate of a conventional semiconductor device module.
Figure 16B:
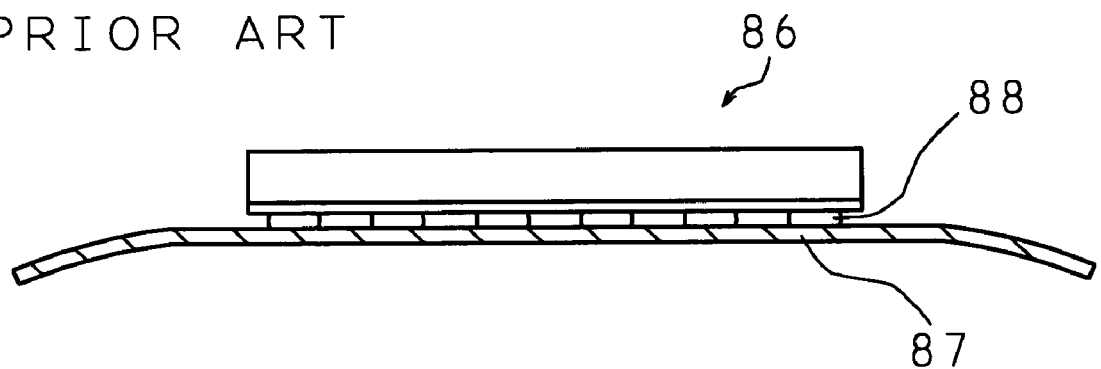
Figure 16C:
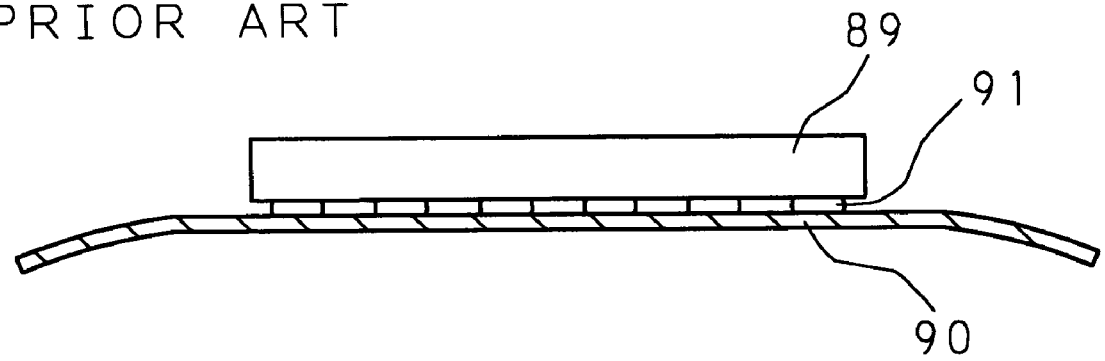
Figure 17A:
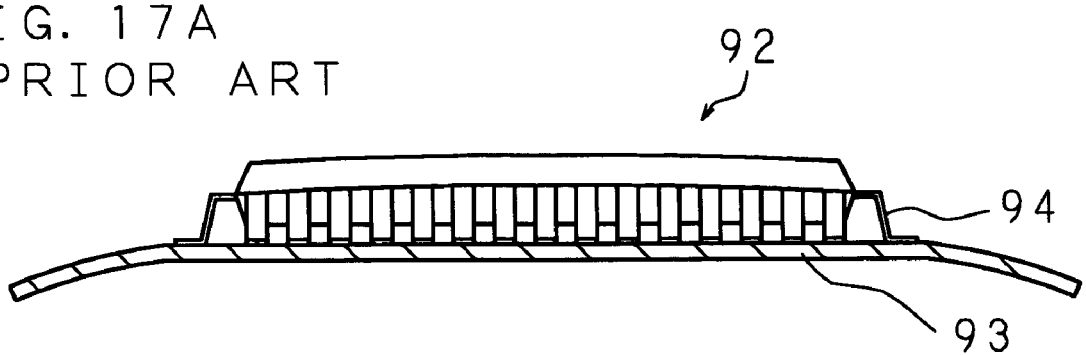
FIG. 17A, FIG. 17B and FIG. 17C are schematic views showing the state in which a bending stress is applied to a bonding substrate of a conventional semiconductor device module.
Figure 17B:
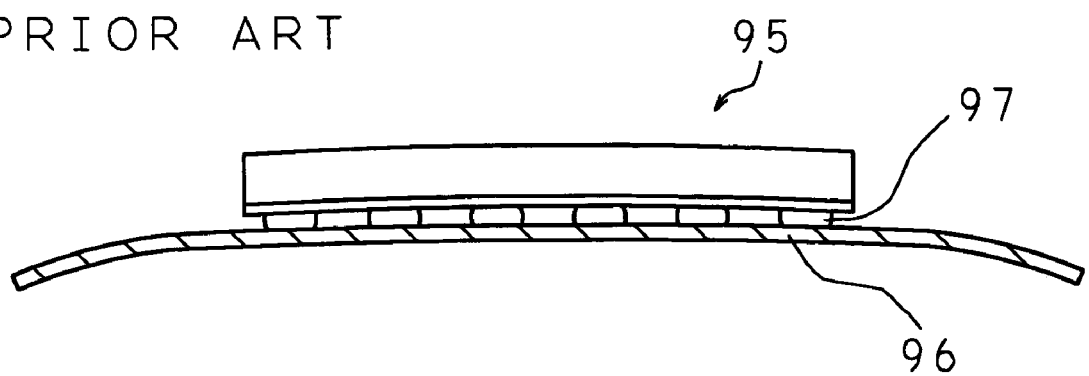
Figure 17C:
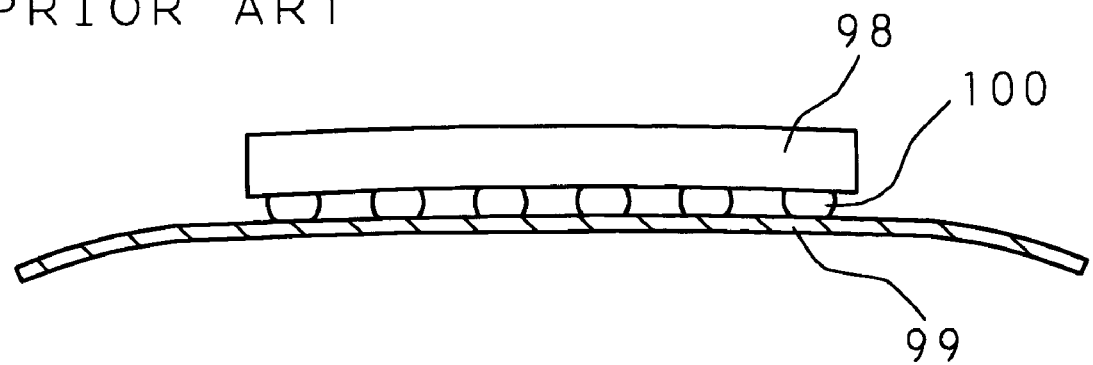

FIG. 12A and FIG. 12B are schematic views showing a manufacturing method of a semiconductor device module according to the present invention. FIG. 12A and FIG. 12B illustrate a method of bonding to a bonding substrate 68 a flexible semiconductor chip T12 with a plurality of grooves 67, 67 . . . which are formed in a portion of the rear surface of a silicon substrate 64 whose front surface is provided with an element forming layer 65 having an element forming region 66 where a semiconductor element (not shown) is formed, the portion corresponding to an element non-forming region of the element forming layer 65. As shown in FIG. 12A, when bonding the semiconductor chip T12 to the bonding substrate 68 being flat, the semiconductor chip T12 is bonded to the bonding substrate 68 by holding the semiconductor chip T12 in a flat state using a holding tool 70 having a flat holding surface 71a for holding the semiconductor chip T12.

Whereas, as shown in FIG. 12B, when bonding the semiconductor chip T12 to the bonding substrate 68 being curved, the semiconductor chip T12 is bonded to the bonding substrate 68 by holding the semiconductor chip T12 in a curved state using a holding tool 71 having a curved holding surface 71a for holding the semiconductor chip T12. Note that the curved shape of the holding surface 71a of the holding tool 71 is preferably a shape similar and corresponding to the curved shape of the bonding surface of the bonding substrate 68. In this case, since the curved shape of the bonding surface of the semiconductor chip T12 held by the holding tool 71 has a shape corresponding to the curved shape of the bonding surface of the bonding substrate 68, it is possible to bond the semiconductor chip T12 surely along the bonding surface of the bonding substrate 68.

According to the present invention, since a groove is formed in the rear surface of a silicon substrate, when a bending stress is applied to a semiconductor device, the portion where the groove is formed can function as a flexible region which is curved according to the bending stress. Therefore, even when a bending stress is applied to a bonding substrate to which the semiconductor device is bonded, the semiconductor device can flexibly correspond to the bending stress.

Moreover, according to the present invention, since mutually parallel grooves are formed in the rear surface of a silicon substrate, a semiconductor device has flexibility to curve in a direction perpendicular to the grooves. Furthermore, according to the present invention, since grooves extending in directions which cross each other are formed in the rear surface of a silicon substrate, a semiconductor device can be curved in directions perpendicular to the respective grooves and thus has further flexibility.

Besides, according to the present invention, since grooves filled with a material softer than a silicon substrate are formed in the rear surface of the silicon substrate, angular sections that are the edges of the opening portions of the grooves do not come into direct contact with each other when the semiconductor device is curved, thereby preventing the semiconductor device from being damaged by the contact. Further, according to the present invention, since grooves are formed in the rear surface of a silicon substrate and the rear surface of the silicon substrate is coated with a material softer than the silicon substrate, angular sections that are the edges of the opening portions of the grooves do not come into direct contact with each other when the semiconductor device is curved, thereby preventing the semiconductor device from being damaged by the contact.

Additionally, according to the present invention, in a semiconductor device module, a semiconductor device with a silicon substrate having grooves formed in the rear surface thereof is bonded to a bonding substrate, and therefore the semiconductor device can be curved in a shape corresponding to the shape of the bonding substrate. Besides, since the semiconductor device is bonded to the bonding substrate capable of being curved, when the semiconductor device module is positioned on a curved place, or a place that may be curved, both of the bonding substrate and the semiconductor device can be curved according to the curved shape. Further, it is also possible to stack such semiconductor chips. Thus, since the semiconductor device module can be positioned on places in a variety of forms, it is very useful.

In addition, according to the present invention, since a groove is formed by grinding, the groove can be formed by a general method for use in dividing a wafer into individual semiconductor chips. Besides, according to the present invention, since a groove is formed by etching, it is possible to prevent mechanical damage to the semiconductor device. Either of dry etching or wet etching may be used, and an etching method can be selected according to the desired groove shape.

Further, according to the present invention, since a semiconductor device with a groove formed in the rear surface of a silicon substrate is bonded to a flat bonding substrate by holding it with a holding tool having a holding surface with a shape corresponding to the shape of a bonding surface to which the semiconductor device is bonded, the semiconductor device can be held in a shape corresponding to the holding surface and bonded along the bonding substrate.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A semiconductor device having an element forming region where a semiconductor element is formed and an element non-forming region where a semiconductor element is not formed, on a front surface of a silicon substrate, comprising:
a plurality of grooves formed in a rear surface of said substrate corresponding to said element non-forming region; and
wherein said grooves are formed to extend in directions crossing each other.

2. The semiconductor device of claim 1, wherein said grooves are formed to extend in directions which cross substantially perpendicular to each other.

3. The semiconductor device of claim 1, wherein said grooves are formed to extend in three different directions.

4. A semiconductor device module comprising
a semiconductor device bonded to a bonding substrate, wherein said semiconductor device has an element forming region where a semiconductor element is formed and an element non-forming region where a semiconductor element is not formed, on a front surface of a silicon substrate, and a groove formed in a portion of a rear surface of said silicon substrate corresponding to said element non-forming region; and
wherein said bonding substrate is curved.

* * * * *